US006505636B1

(12) United States Patent
Travis

(10) Patent No.: US 6,505,636 B1
(45) Date of Patent: Jan. 14, 2003

(54) APPARATUS FOR WAFER CARRIER IN-PROCESS CLEAN AND RINSE

(75) Inventor: Glenn W. Travis, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 215 days.

(21) Appl. No.: 09/603,573

(22) Filed: Jun. 26, 2000

(51) Int. Cl.$^7$ ................................................ B08B 3/00
(52) U.S. Cl. ...................... 134/179; 134/172; 134/200; 134/902; 451/67; 451/73
(58) Field of Search ................................ 134/172, 176, 134/179, 200, 902; 451/67, 73

(56) References Cited

U.S. PATENT DOCUMENTS

| | | | |
|---|---|---|---|
| 4,141,180 A | 2/1979 | Gill, Jr. et al. | 51/5 R |
| 4,193,226 A | 3/1980 | Gill, Jr. et al. | 51/124 R |
| 4,680,893 A | 7/1987 | Cronkhite et al. | 51/5 R |
| 5,135,015 A * | 8/1992 | Young | 134/172 |
| 5,253,809 A * | 10/1993 | Poppitz et al. | 134/179 |
| 5,351,360 A | 10/1994 | Suzuki et al. | 15/302 |
| 5,624,501 A | 4/1997 | Gill, Jr. | 134/6 |
| 6,287,178 B1 * | 9/2001 | Huynh et al. | 239/556 |
| 6,336,845 B1 * | 1/2002 | Engdahl et al. | 451/285 |

* cited by examiner

Primary Examiner—Alexander Markoff
Assistant Examiner—Joseph Perrin
(74) Attorney, Agent, or Firm—Brinks Hofer Gilson & Lione

(57) ABSTRACT

A system and method for rinsing and cleaning a wafer carrier and a semiconductor wafer mounted thereon during a chemical mechanical planarization (CMP) process is provided. The system includes a head spray assembly that comprises a plurality of spray nozzles positioned therein. The head spray assemble is moveably positionable between a park position and a spray position. The spray position is adjacent the wafer carrier such that liquid discharged from the spray nozzles is in liquid communication with the wafer carrier, the semiconductor wafer and the interior of the head spray assembly. The system provides aggressive and uniform cleaning and rinsing while containing and collecting the liquid discharged from the spray nozzles and the materials rinsed from the wafer carrier and semiconductor wafer.

22 Claims, 6 Drawing Sheets

APPARATUS FOR WAFER CARRIER IN-PROCESS CLEAN AND RINSE

FIELD OF THE INVENTION

The present invention relates to the planarization of semiconductor wafers using a chemical mechanical planarization technique. More particularly, the present invention relates to an improved system and method for cleaning and rinsing residual slurry from semiconductor wafers during the chemical mechanical planarization process.

BACKGROUND

Semiconductor wafers are typically fabricated with multiple copies of a desired integrated circuit design that will later be separated and made into individual chips. Wafers are commonly constructed in layers, where a portion of a circuit is created on a first level and conductive vias are made to connect up to the next level of the circuit. After each layer of the circuit is etched on the wafer, an oxide layer is put down allowing the vias to pass through but covering the rest of the previous circuit level. Each layer of the circuit can create or add unevenness to the wafer that must be smoothed out before generating the next circuit layer.

Chemical mechanical planarization (CMP) techniques are used to planarize the raw wafer and each layer of material added thereafter. Available CMP systems, commonly called wafer polishers, often use a rotating wafer carrier that brings the wafer into contact with a polishing pad rotating in the plane of the wafer surface to be planarized. A polishing fluid, such as a chemical polishing agent or slurry containing microabrasives is applied to the polishing pad to polish the wafer. The wafer carrier then presses the wafer against the rotating polishing pad and is rotated to polish and planarize the wafer.

Following the polishing and planarization operation, the wafer carrier is lifted off of the polishing pad and retained in a conveyor that is used to transport the wafer and wafer carrier. The external surfaces of the wafer carrier and the face of the wafer are typically coated with the residual polishing fluid and the material removed from the wafer surface during the operation. These materials are typically removed using deionized water (D.I. water). Presently known methods of material removal involve manual spraying or a head diametrical wash system. Manual spraying is accomplished with a spray hose that is manipulated by an operator of the CMP system.

The head diametrical wash system comprises fixed holes that are included on the conveyor. The holes surround the upper portion of the wafer carrier when it is retained in the conveyor. The holes are piped to a D.I. water supply that is pressurized to spray D.I. water out the holes and onto the outer surface of the wafer carrier. The D.I. water flows by gravity down the outer surfaces of the wafer carrier and across the horizontal face of the wafer that is mounted on the bottom of the wafer carrier. The D.I. water containing the materials rinsed from the wafer carrier and wafer then forms into droplets that drip from the wafer down onto the polishing pad and elsewhere in the CMP system.

Known problems exist with these rinsing and cleaning techniques. Specifically, the manual spraying is time consuming, manpower intensive, generates overspray on other parts of the CMP system and may provide non-uniform results. In the case of the diametrical face wash, the washing action lacks scrubbing effect. In addition, the flow of the D.I. water across the face of the semi-conductor wafer is non-uniform since it depends on the molecular attraction of the water to the surfaces of the wafer carrier and the wafer. The non-uniform flow of water may contribute to non-uniform washing of the wafer. This is especially true as the diameter of the face of the wafer is increased. Further, the D.I. water containing the residual polishing fluid and the material removed from the wafer surface is allowed to run into the CMP system thereby contributing additional foreign materials and particulate to the CMP process.

Accordingly, there is a need for systems and methods of rinsing and cleaning wafer carriers and semiconductor wafers that is automatic, efficient, thorough and capable of being contained.

SUMMARY

To address the deficiencies of the prior art, methods and systems are described herein that are capable of automated operation in a CMP system to provide a uniform, thorough and efficient cleaning and rinsing of a wafer carrier and a semiconductor wafer mounted thereon. A presently preferred embodiment comprises a head spray assembly that is moveable between a parked position and a spray position. In the spray position, the head spray assembly is adjacent a wafer carrier that is detachably mounted in a conveyor.

The head spray assembly is capable of sealing to a portion of the conveyor surrounding the wafer carrier prior to activation of a plurality of spray nozzles disposed therein. Upon activation, the spray nozzles discharge pressurized liquid thereby causing the spray nozzles to rotate. The liquid discharged from the spray nozzles is discharged through an opening in the head spray assembly and is in liquid communication with the wafer carrier and the semiconductor wafer thereon. The rotating spray action of the discharged liquid cleans and rinses the wafer carrier and semiconductor wafer. The liquid that washes the wafer carrier and the semiconductor wafer is contained due to the seal with the conveyor and is channeled to a drain for transfer out of the CMP system.

Other features and advantages of the invention will be apparent from the drawings and the more detailed description of the invention that follows. The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
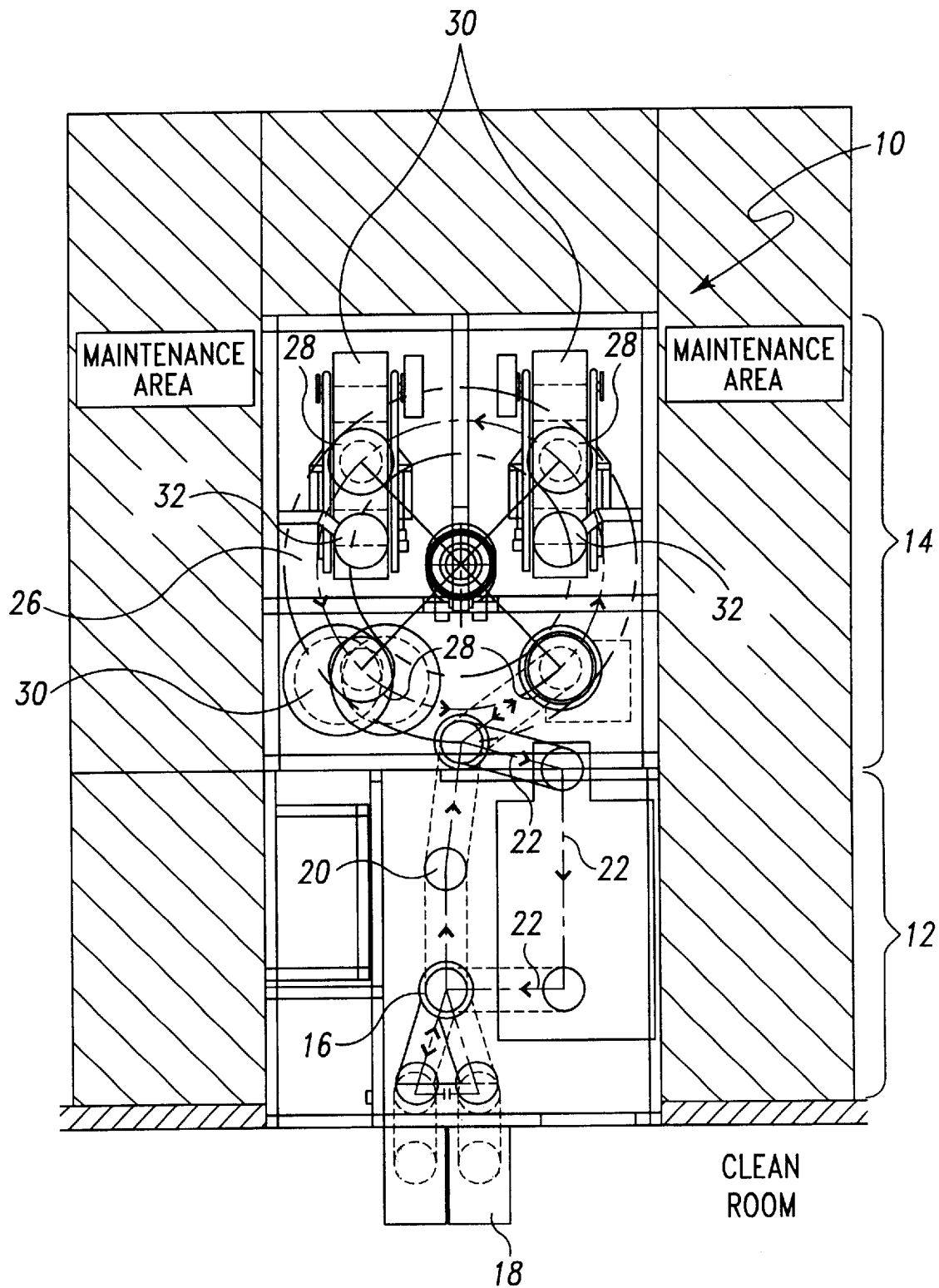
FIG. 1 is a plan view schematic of a semiconductor wafer polishing system according to a preferred embodiment of the present invention.

A presently preferred embodiment of a wafer polishing system 10 is generally illustrated in FIG. 1. One example of an automated wafer polishing system 10 is the TERES™ Chemical Mechanical Polishing (CMP) system available from Lam Research Inc. located in Fremont, Calif. FIG. 1 is a plan view of the wafer polishing system 10 that includes a front-end portion 12 connected to a back-end portion 14. The wafer polishing system 10, typically used in a semiconductor wafer fabrication facility, receives semiconductor wafers 16 at the front-end portion 12 from a wafer holder 18 that is adjacent to the front-end portion 12. The semiconductor wafers 16, hereinafter referred to as wafers 16, are circular shaped discs that are separable into individual chips containing integrated circuits. The wafer holder 18 is a rack or other similar structure capable of holding the wafers 16 in a uniform and organized fashion.

The front-end portion 12 retrieves the wafers 16 from the wafer holder 18 and transfers the wafers 16 to the back-end portion 14 as illustrated generally by arrow 20. The back-end portion 14 planarizes the wafers 16 and then returns the wafers 16 to the front-end portion 12 for final cleaning, rinsing and drying. In general, the wafers 16 are completely processed in the front and back end portions 12,14 and are then returned to a predetermined location, in a clean, dry, and uniformly planarized condition. In the presently preferred embodiments, the wafers 16 are returned to the wafer holder 18 as illustrated by arrows 22.

The back-end portion 14 includes a conveyor 26, a plurality of wafer carriers 28, a plurality of belt polishing modules (BPMs) 30 and a plurality of head spray mechanisms 32. Individual wafers 16 that are transferred from the front-end portion 12 are received by the back-end portion 14 and loaded onto the conveyor 26. The conveyor 26 could be a longitudinally extending belt, a robot arm or any other mechanism capable of conveying wafers 16. the presently preferred conveyor 26 is a generally circular table that is rotatably controlled by a motor (not shown).

Figure 2:
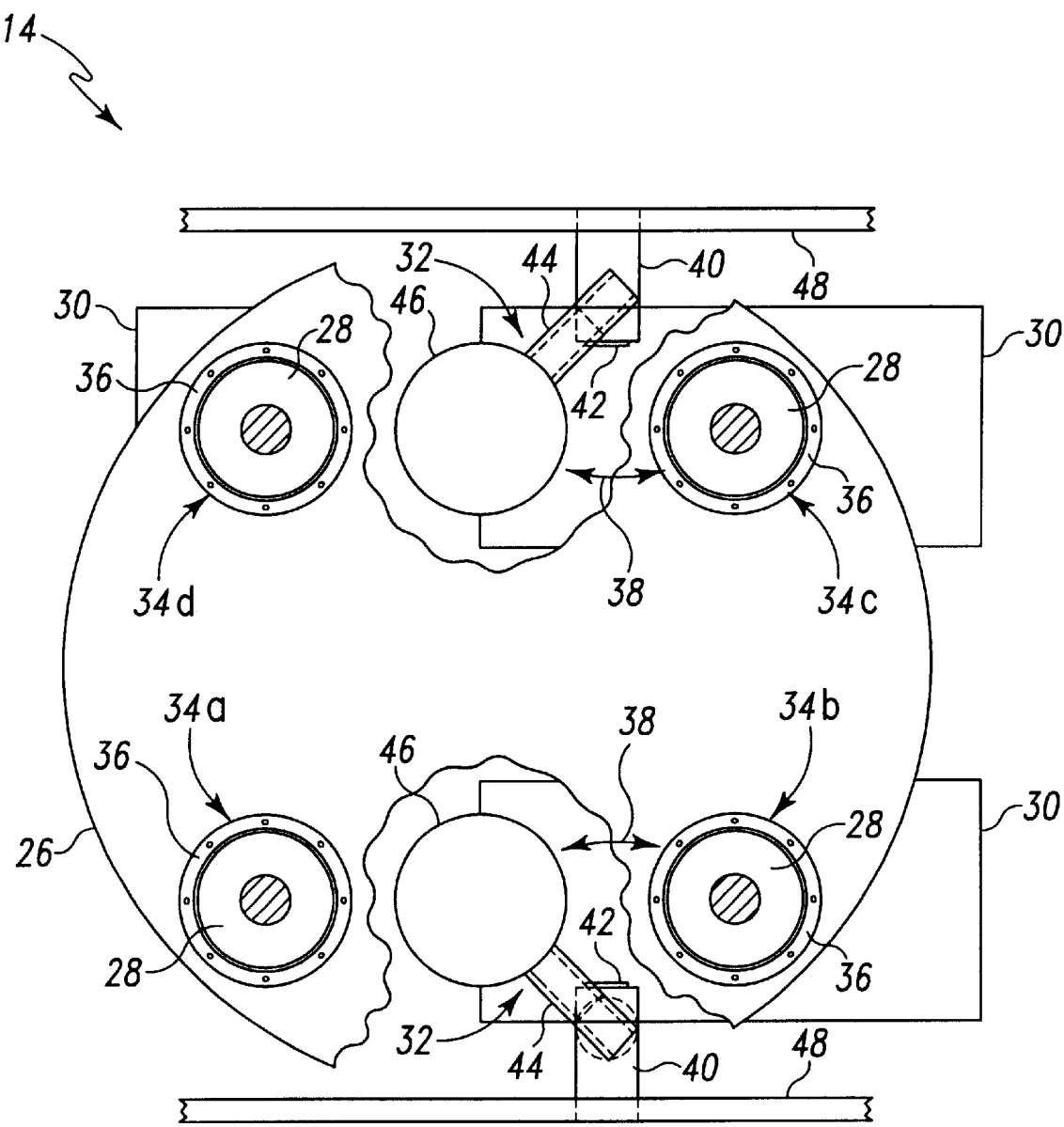
FIG. 2 is a plan view schematic of a portion of the semiconductor wafer polishing system of FIG. 1 with portions of the presently preferred conveyor broken away.

FIG. 2 illustrates a plan view of a part of the back-end portion 14 illustrated in FIG. 1 with portions of the conveyor 26 removed for illustrative purposes. In the presently preferred embodiments, the conveyor 26 includes four stations 34; namely, a load/unload station 34a, a first polishing station 34b, a second polishing station 34c and a buff station 34d. The conveyor 26 could, for example, have more stations 34 providing similar or different functions as required by the wafer polishing system 10.

Each station includes a wafer carrier 28 that is detachably coupled to the conveyor 26 by a head retainer ring 36. The head retainer ring 36 is fixedly coupled to the conveyor 26 by fasteners, such as, for example, nuts and bolts, welding, rivets or other similar fastening mechanism. The coupling of the wafer carrier 28 and the head retainer ring 36 can be, for example, by friction fit, snap fit, threaded connection or other similar detachably connective mechanism. A more detailed discussion of some methods and systems of detachably coupling the conveyor 26 with the wafer carriers 28 is described in co-pending U.S. patent application entitled "Locking Mechanism for Detachably Securing a Wafer Carrier to a Conveyor" to Travis, application Ser. No. 09/606,071, filed on Jun. 29, 2000, that is herein incorporated by reference. When the wafer carrier 28 is detachably coupled with the conveyor 26, an annular cavity (not shown) that is open at one end is formed therebetween.

The wafers 16 are loaded onto the conveyor 26 at the load/unload station 34a by being positioned on the wafer carriers 28. The wafer carriers 28 are an assembly capable of fixedly holding the wafers 16 during processing. In the presently preferred embodiments, the wafers 16 are fixedly positioned on a bottom face (not shown) of the wafer carriers 28 by surface tension or partial vacuum. The wafer 16 is positioned such that the circular face of the wafer 16 that is subject to planarization radially extends to cover a portion of the bottom of the wafer carrier 28.

When the wafer carriers 28 are selectively positioned at the first polishing station 34b, the second polishing station 34c and the buff station 34d, the wafer carriers 28 are located above the BPMs 30. The presently preferred BPMs 30 are positioned such that the wafer carriers 28 can be detached from the conveyor 26 and lowered to make contact between the face of the wafer 16 and the BPMs 30 during a polishing operation. The BPMs 30 can be, for example, linear or rotary wafer polishers that operate to remove material from the surface of the wafers 16 using polishing fluid such as a chemical agent or a slurry containing micro abrasives. In the presently preferred embodiments, there are three BPMs 30 comprising first and second polishers and a buffer.

The head spray mechanisms 32 operate to rinse and clean the wafer carriers 28 and the respective wafer 16 thereon. The head spray mechanisms 32 can be adapted for use anywhere in the wafer polishing system 10 where washing is required. In the presently preferred embodiments, the head spray mechanisms 32 are positioned under the conveyor 26 and are associated with the first and second polisher stations 34b and 34c. The head spray mechanisms 32 are independently operable to discharge pressurized liquid when actuated.

The presently preferred head spray mechanisms 32 are deactivated and placed in a first position during polishing operations at the respective stations 34b, 34c. The first position is referred to as a park position and is illustrated in FIG. 2. The head spray mechanisms 32 are also independently operable to be movably positioned adjacent the wafer carriers 28 in a second position that is referred to as a spray position as illustrated by arrows 38. In the park position, the head spray mechanisms 32 are spaced away from the wafer carrier 28 a sufficient distance to avoid interference with the polishing operation. Conversely, in the spray position, a portion of the presently preferred head spray mechanisms 32 are positioned at the respective first and second polishing stations 34b and 34c.

During operation of the presently preferred embodiments, when the wafer carriers 28 are detachably coupled with the conveyor 26 following a polishing operation, the head spray mechanisms 32 are activated in an automated fashion. The wafer polishing system 10 determines when to activate the head spray mechanisms 32 by monitoring the coupling of the wafer carriers 28 with the conveyor 26. Coupling of the wafer carriers 28 with the conveyor 26 may be determined by, for example, limit switches, proximity switches or predetermined positioning of the wafer carriers 28. When the wafer carriers 28 are successfully coupled with the conveyor 26, the head spray mechanisms 32 are moved to the spray position by the wafer polishing system 10.

In the spray position, each head spray mechanism 32 is operably positioned adjacent a wafer carrier 28 with a wafer 16 disposed therebetween. When the head spray mechanism 32 is actuated in the spray position, pressurized liquid is discharged therefrom. The pressurized liquid is in liquid communication with the wafer 16 and the wafer carrier 28 to provide a rinsing and cleansing action thereon. The liquid discharged by the head spray mechanism 32 is contained and channeled to a drain outlet 98 (see FIGS. 6 and 7) for removal from the wafer polishing system 10 as is hereinafter described. The position of the head spray mechanism 32 with respect to the wafer carrier 28 when in the spray position may be above, below, beside or some combination thereof.

The presently preferred head spray mechanism 32 operates to clean residual slurry and other particulate material from the wafer 16 and the wafer carrier 28 following each polishing operation. The cleaning action is aggressive and provides uniform removal of the residual polishing fluid and the materials removed from the surface of the wafer 16. The fluids and materials are removed by pressurized liquid that is contained and collected by the head spray mechanism 32. Containment and collection prevents introduction of the liquid containing the polishing fluid and materials removed from the surface of the wafer 16 to other portions of the wafer polishing system 10.

Figure 3:
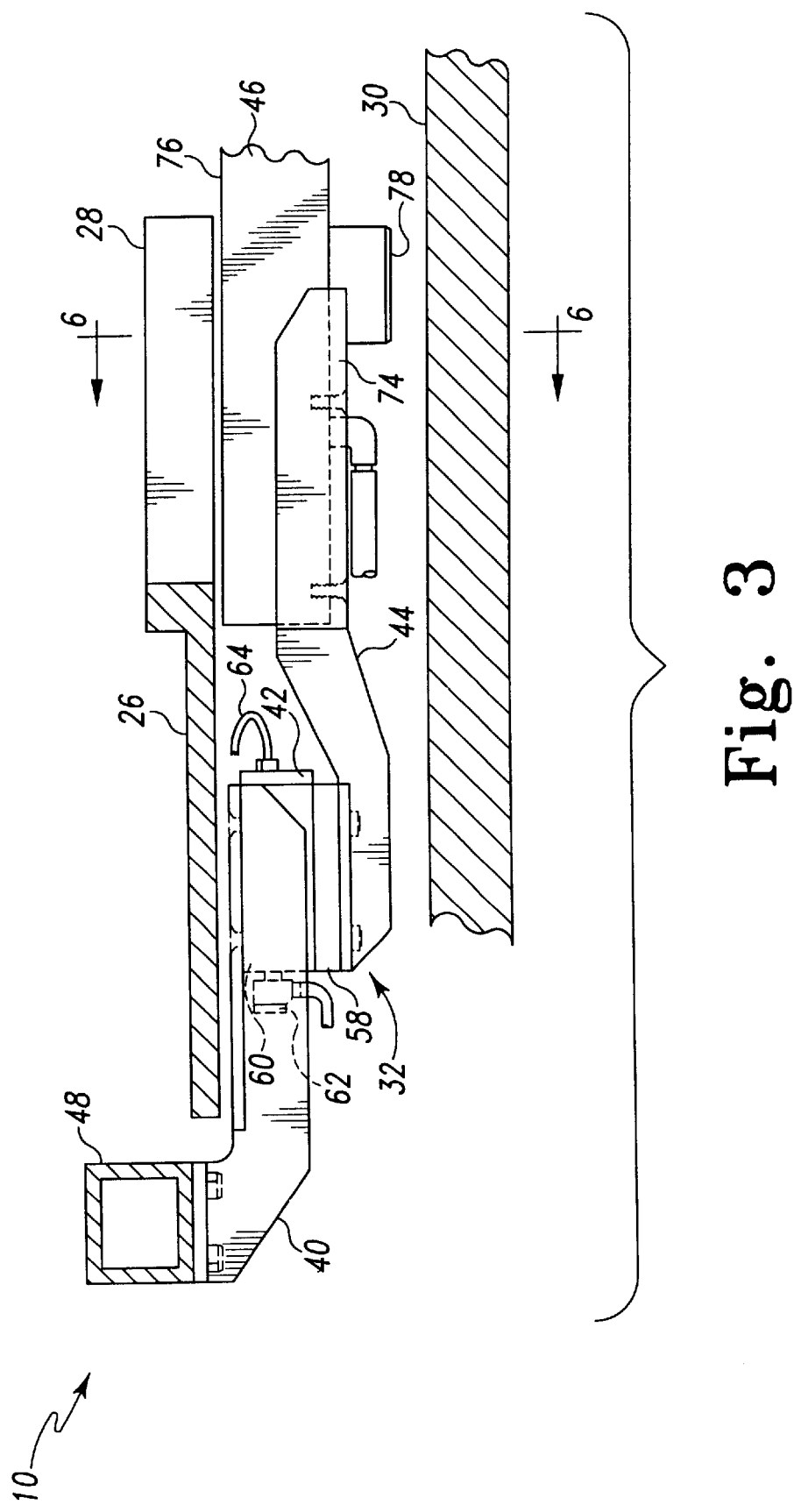
FIG. 3 is an elevational side view of a portion of the semiconductor wafer polishing system of FIG. 2 with portions of the presently preferred conveyor, BPM and frame broken away.

As further illustrated in FIG. 2, the presently preferred head spray mechanism 32 comprises a mounting bracket 40, a rotary actuator 42, a rotary arm 44 and a head spray assembly 46. FIG. 3 illustrates an elevation view of a portion of the wafer polishing system 10 illustrated in FIG. 2 with a portion of the conveyor 26 sectioned away to more fully illustrate the wafer carrier 28 and the head spray mechanism 32. Referring now to FIGS. 2 and 3, a portion of the head spray mechanism 32 is positioned between the conveyor 26 and one of the BPMs 30 as shown. The head spray mechanism 32 is fixedly mounted to a frame 48 that forms a part of the back-end portion 14 of the wafer polishing system 10. The frame 48 can be formed from steel, for example, or some other rigid material capable of supporting the head spray mechanism 32. The head spray mechanism 32 is fixedly coupled to the frame 48 by the mounting bracket 40.

Figure 4:
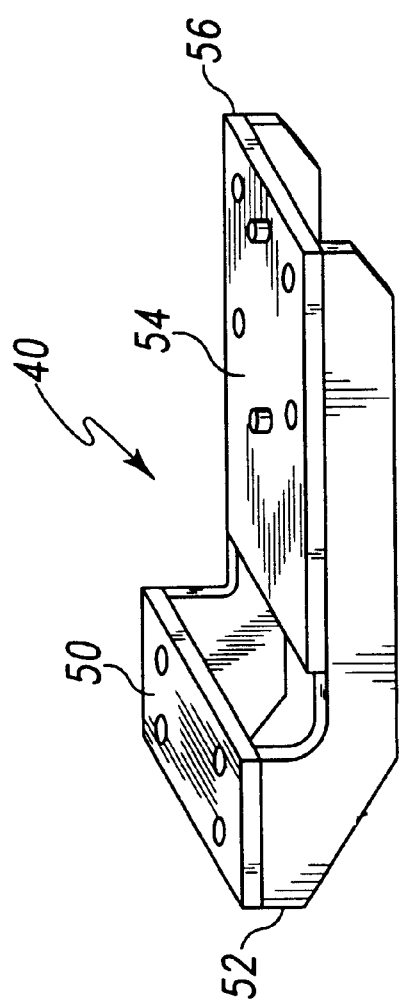
FIG. 4 is a perspective view of a presently preferred mounting bracket illustrated in FIG. 3.

Referring now to FIG. 4, the presently preferred mounting bracket 40 is illustrated in a perspective view detached from the frame 48 and the remainder of the head spray mechanism 32. The mounting bracket 40 is formed from rigid material such as, for example, metal, plastic or other similar material with corrosive resistant properties and sufficient axial and torsional strength to support the remainder of the head spray mechanism 32. The top surface of a first plate 50 at a proximal end 52 of the longitudinally extending mounting bracket 40 is coupled to the frame 48 by fasteners, such as, for example, nuts and bolts, rivets, welding or similar fastening mechanism. The presently preferred mounting bracket 40 is formed from welded ¼" stainless plate that is coupled to the frame 48 by bolts and screws. The bottom surface of a second plate 54 at a distal end 56 of the mounting bracket 40 is coupled to the rotary actuator 42.

Referring again to FIGS. 2 and 3, the rotary actuator 42 is a device capable of rotational movement of a shaft or similar rotatable element when activated. The rotary actuator 42 can be, for example, a pneumatic or electric actuator that is impervious to a corrosive, wet environment and can be controlled remotely. One suitable rotary actuator 42, is the pneumatic rotary actuator model number RR-36 manufactured by Robohand Inc.

The rotary actuator 42 comprises a rotatable head 58 and a base 60. The base 60 is fixedly coupled to the distal end 56 of the mounting bracket 40 by fasteners, such as, for example, bolts and screws, dowel pins or similar fastening mechanism. As shown, the presently preferred base 60 is fastened to the mounting bracket 40 by nuts and bolts and includes dowel pins. In addition, a plurality of pneumatic air supply lines 62 and a plurality of electrical cables 64 are also coupled to the presently preferred rotary actuator 42. The pneumatic air supply lines 62 are coupled with a pressurized air source (not shown) that selectively supplies pressurized air therethrough. The electrical cables 64 electrically connect a plurality of limit switches (not shown) located within the rotary actuator 42 with the wafer polishing system 10.

The rotatable head 58 is rotatably connected to the base 60. In addition, the rotatable head 58 is fixedly coupled to the rotary arm 44 by fasteners, such as, for example, nuts and bolts, rivets, welding or similar fastening mechanism. In the presently preferred embodiments, the rotatable head 58 comprises a flat plate formed from steel or similar material that is adapted to be fixedly coupled to the rotary arm 44 by nuts and bolts and includes dowel pins to maintain alignment. The base 60 includes a motor or similar prime mover (not shown) that is capable of imposing rotatable torque on the rotatable head 58 when actuated. The presently preferred wafer polishing system 10 controls the operation of the rotary actuator 42 by selectively pressurizing the pneumatic air supply lines 62 and monitoring the status of the limit switches. The rotatable head 58 rotates to pivotally swing the rotary arm 44 to predetermined positions.

Figure 5:
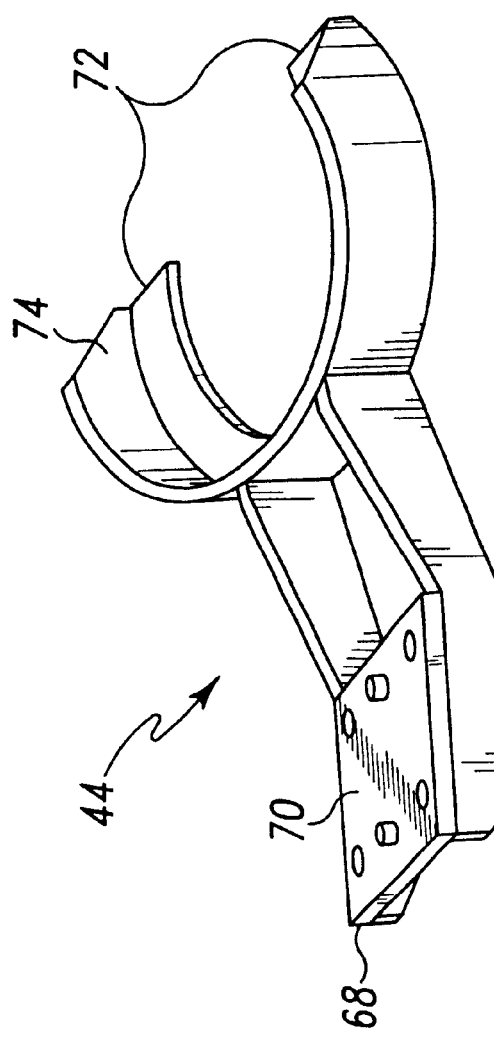
FIG. 5 is a perspective view of a presently preferred rotary arm illustrated in FIG. 3.

Referring now to FIG. 5, the rotary arm 44 is illustrated in a perspective detached from the rotary actuator 42 and the head spray assembly 46. The rotary arm 44 can be formed of, for example, metal, plastic or other similar corrosion resistant rigid material capable of supporting the head spray assembly 46. The presently preferred rotary arm 44 is made of welded 3/16" stainless steel plate. The longitudinally extending rotary arm 42 is adapted to be coupled to the rotatable head 58 at a proximal end 68 that comprises a third flat plate 70. A distal end 72 of the rotary arm 44 forms an enclosure support 74 that is fixedly connected to the head spray assembly 46. The presently preferred enclosure support 74 is a generally horseshoe shaped structure that is adapted to partially surround the head spray assembly 46 to provide vertical and horizontal support thereto. The rotary arm 44 is coupled to the head spray assembly 46 by fasteners, such as, for example, screws, rivets or similar fastening mechanism. Screws fasten the rotary arm 44 to the head spray assembly 46 in the presently preferred embodiments.

Referring to FIGS. 2 and 3, the presently preferred head spray assembly 46 is a generally circular structure that is formed to be slightly larger in diameter than the wafer carriers 28. The presently preferred head spray mechanism 32 is illustrated in the spray position in FIG. 3 such that the head spray assembly 46 is positioned between the wafer carrier 28, which is detachably coupled with the conveyor 26, and the BPM 30. As illustrated, the top of the head spray assembly 46 is positioned with a top surface 76 adjacently below the wafer carrier 28 such that the wafer 16 (not shown in FIGS. 2 and 3) is positioned therebetween. In addition, the bottom of the head spray assembly 46 is positioned with a bottom surface 78 adjacently above the BPM 30. In other preferred embodiments, the head spray assembly 46 may be oriented with the top surface 76 adjacently above, beside, below or some combination thereof with respect to the wafer carrier 28. In these preferred embodiments, the orientation of the head spray assembly 46 with respect to the wafer carrier 28 is dependent on the attachment of the wafer carrier 28 to the conveyor 26, and the location of the wafer 16 on the wafer carrier 28.

Figure 6:
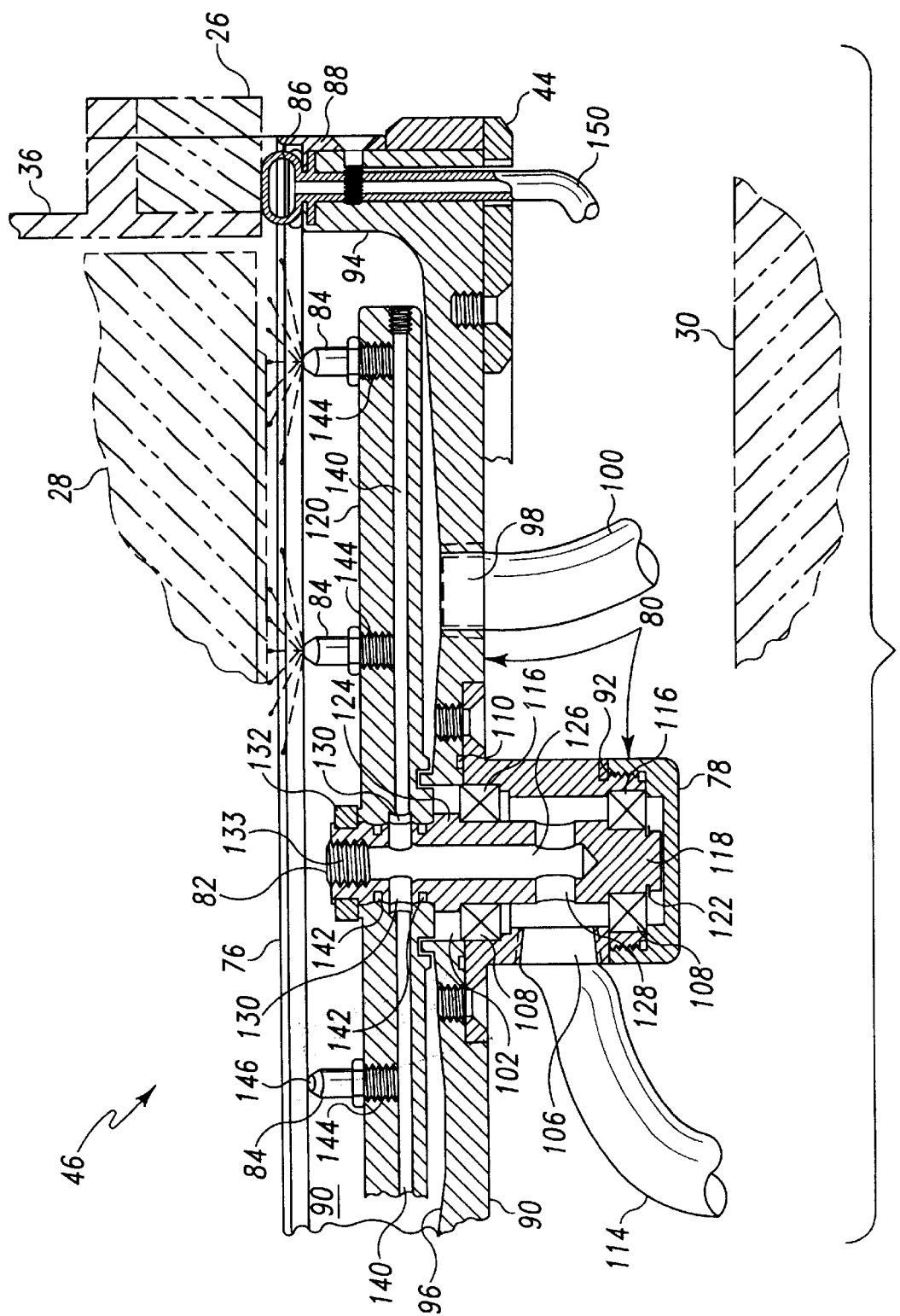
FIG. 6 is a cross sectional view of a portion of a presently preferred head spray mechanism taken along line 6—6 in FIG. 3.

FIG. 6 illustrates a cross sectional view of a portion of the wafer polishing system 10 illustrated in FIG. 3 that includes the conveyor 26, the wafer carrier 28, the rotary arm 44 and the head spray assembly 46. The head spray assembly 46 includes a housing 80, a rotating element 82, a plurality of spray nozzles 84, a bladder 86 and a bladder retainer ring 88 as illustrated. The housing 80 can be formed of plastic, metal or other similar rigid material. In the presently preferred embodiments, the housing 80 is formed from polyethylene terephthalate (PET).

The presently preferred housing 80 includes a spray cavity 90 and a bearing enclosure 92. The spray cavity 90 forms the upper portion of the housing 80 and generally resembles a cup-like shape. At the top of the head spray assembly 46, the spray cavity 90 includes an opening that is defined by an annular wall 94 that forms the top surface 76. The annular wall 94 extends from the top surface 76 to a basin 96 that is integrally formed with the annular wall 94 and defines the closed end of the spray cavity 90.

The presently preferred basin 96 is sloped in the horizontal plane towards a drain outlet 98 to allow gravitational drainage of liquid from the spray cavity 90. The drain outlet 98 is an aperture that penetrates the basin 96 and is coupled with a drain hose 100. The drain hose 100 forms a passageway to channel liquid out of the wafer polishing system 10. In another preferred embodiment, the drain outlet 98 may be located, for example, in the annular wall 94 or other advantageous location to provide gravitational drainage based on the orientation of the head spray assembly 46. The basin 96 also includes a shaft aperture 102 that forms a passageway to the bearing enclosure 92.

The presently preferred bearing enclosure 92 includes a liquid inlet 106 and a plurality of bearings 108 as illustrated in FIG. 6. The bearing enclosure 92 is a generally cylindrical, longitudinally extending, hollow tube that includes an integrally formed circumferentially surrounding lip to facilitate coupling with the spray cavity 90 at a first end 110. Fasteners, such as, for example, screws fixedly coupled the bearing enclosure 92 to the spray cavity 90, as illustrated. The bottom surface 78 of the head spray assembly 46 forms an enclosed second end of the bearing enclosure 92.

The liquid inlet 106 is an aperture in the outer surface of the bearing enclosure 92 that is in liquid communication with the hollow interior of the bearing enclosure 92 and with a liquid supply line 114. The liquid supply line 114 forms a passageway to a pressurized liquid supply (not shown). The wafer polishing system 10 using, for example, pilot operated pneumatic valves (not shown), or other similar pressure control devices, controls the supply of pressurized liquid to the liquid supply line 114.

The bearings 108 are sealed thrust bearings that are axially positioned in the bearing enclosure 92 near the first end 110 and near the bottom surface 78. The rotatable bearings 108 are fixedly mounted in annular grooves 116 in the inner surface of the bearing enclosure 92 by friction fit, adhesive fit or other similar mounting mechanism. The bearings 108 circumferentially surround a portion of the rotating element 82 that is disposed within the housing 80.

The rotating element 82 comprises a rotary shaft 118 and a manifold 120. The rotating element 82 is rotatably coupled with the housing 80 by the rotary shaft 118. The rotary shaft 118 axially extends through the hollow interior of the bearing enclosure 92 and is held in position by the bearings 108. The rotary shaft 118 can be formed of, for example, steel, plastic or other similarly rigid material.

The presently preferred rotary shaft 118 is stainless steel and is fixedly positioned within the bearings 108 by a snap ring 122 and a shoulder 124. The snap ring 122 circumferentially surrounds the rotary shaft 118 and is mounted within an annular groove (not shown) in the surface thereof. The shoulder 124 is an integrally formed raised annular ring that surrounds a portion of the rotary shaft 118 as shown. The rotary shaft 118 is also formed to include an internal passageway 126 that axially extends from a first aperture 128 to a plurality of second apertures 130. The passageway 126 is in liquid communication with the liquid inlet 106 via the first aperture 128, and the manifold 120 via the second apertures 130.

The manifold 120 is coupled to the rotary shaft 118 by being fixedly compressed between the shoulder 124 and a fastener 132. The fastener 132 can be for example, a weld, a threaded connection or any other similar fastening mechanism. The presently preferred fastener 132 is a locknut that engages threads 133 on the outer surface of the rotary shaft 118.

Figure 7:
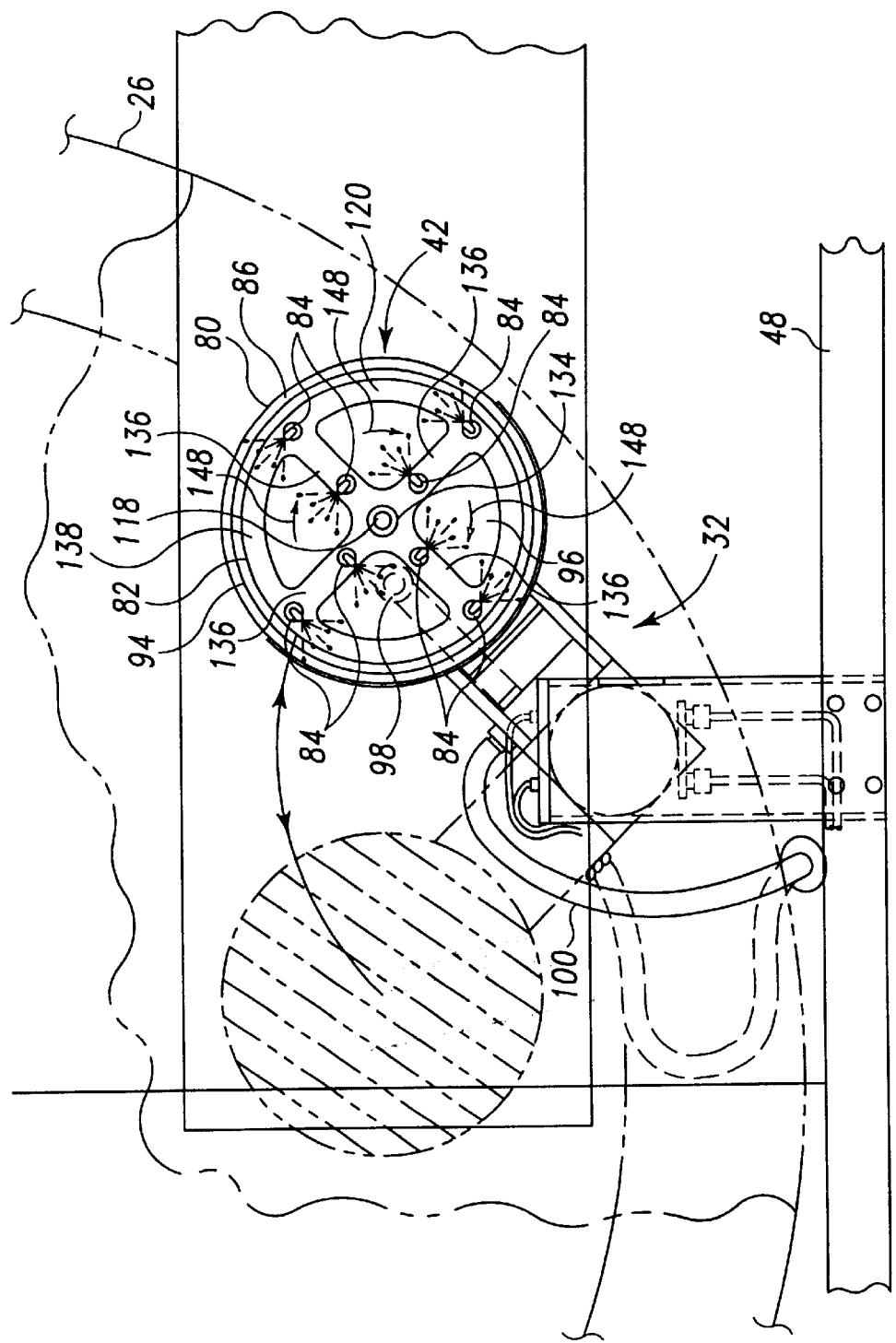
FIG. 7 is a plan view of a portion of the semiconductor wafer polishing system of FIG. 2 showing additional detail with regard to the presently preferred head spray mechanism.

FIG. 7 illustrates a portion of the conveyor 26 and the head spray mechanism 32 illustrated in FIG. 2 with the wafer carrier 28 removed for illustrative purposes and the head spray mechanism 32 illustrated in the spray position. The presently preferred manifold 120 is illustrated in FIG. 7 and includes a hub 134, a plurality of spokes 136 and an outer ring 138 as illustrated. The hub 134 is adapted to circumferentially surround an upper portion of the rotary shaft 118 and is concentric therewith. Integrally formed with the hub 134 are the spokes 136. The spokes 136 extend radially outward from the hub 134 parallel to the basin 96 and are integrally formed with the outer ring 138. The outer ring 138 is concentric with the hub 134 and the rotary shaft 118 and is adjacent to the annular wall 94. The surface of the manifold 120 that is adjacent the opening in the top of the head spray assembly 42 defines a face of the rotating element 82.

The spokes 136 are hollow and define passageways 140 therein that extend through the hub 134 and are in liquid communication with the second apertures 130. A plurality of O-rings 142 are positioned to circumferentially surround the rotary shaft 118 on opposite sides of the second apertures 130 to form a watertight seal between the rotary shaft 118 and the manifold 120. The O-rings 142 can be formed of rubber, silicone or other similar material capable of creating a seal. In the presently preferred embodiments, the O-rings 142 are Buna-N rubber. The passageways 140 are also in liquid communication with a plurality of apertures 144 that are located on the face of the rotating element 82 and penetrate the surface of the spokes 136.

Also positioned on the face of the rotating element 82 are the spray nozzles 84. Referring now to FIGS. 6 and 7, the spray nozzles 84 can be coupled to the apertures 144 by threaded connection, snap fit, frictional fit or some other similar fastening mechanism. In the presently preferred embodiments, the spray nozzles 84 are coupled to the manifold 120 by threaded connection. The spray nozzles 84 are formed to include an internal passageway (not shown) that is in liquid communication with the passageways 140 via the apertures 144. The longitudinally extending internal passageway of each spray nozzle 84 extends to an aperture 146 located near the end of the spray nozzle 84 that is opposite the manifold 120 as best illustrated in FIG. 6. In the presently preferred embodiments, the apertures 146 are formed to provide a predetermined spray pattern at an angle of between about 45 and 60 degrees with respect to the longitudinal axis of the spray nozzles 84. The spray pattern can be, for example, a fan spray pattern, a cone spray pattern or any other pattern that provides a uniform spraying action.

The angle of the spray pattern can be any angle that is capable of discharging liquid through the opening at the top of the housing 80 while creating a reverse force. The reverse force is defined to be a force vector that is parallel to the face of the manifold 120 and has sufficient rotational force to impart rotation upon the rotating element 82 as illustrated by arrows 148 in FIG. 7. The reverse force is created in a direction that is generally opposite the direction that the liquid is discharged from the spray nozzles 84. The direction of the discharge of liquid from the spray nozzles 84 is uniformly aligned such that the reverse forces created by the liquid discharge work cooperatively to impart rotation on the rotating element 82. In the presently preferred embodiments, there are eight spray nozzles 84 that are uniformly distributed on the face of the rotating element 82 to impart rotation thereon when activated to discharge liquid.

In another preferred embodiment, the spray nozzles 84 are individually rotatable with respect to the rotating element 82 as a result of the reverse force created by liquid discharged from the spray nozzles 84. In this embodiment, the rotating element 82 is fixedly coupled to the housing 80 and the spray nozzles 84 rotate therein. Individual rotation of the spray nozzles 84 can result from, for example, the apertures 146 being offset from the central axis of the spray nozzles 84; or the spray nozzles 84 being mounted in rotatable disks (not shown) offset from the rotating axis thereof. In yet another preferred embodiment, the rotation of the rotating element 82 is created by, for example, a motor (not shown), water impacting an impeller(not shown) or other prime mover that is capable of imparting rotational force on the rotating element 82.

Referring again to FIG. 6, circumferentially surrounding the annular wall 94 toward the top surface 76 thereof is the bladder 86. The bladder 86 is compressibly retained against the exterior surface of the annular wall 94 by the bladder retainer ring 88 as shown. The bladder retainer ring 88 circumferentially surrounds the bladder 86 and is coupled to the annular wall 94 by fasteners. The fasteners of the presently preferred embodiment are bolts, but could be for example welds, rivets or similar fastening mechanism. The inflatable bladder 86 can be formed of, for example, rubber, silicone or some other flexible material capable of being expanded and contracted. In the presently preferred embodiments, the bladder is Buna-N rubber.

The bladder 86 forms an annular ring that has an interior annulus that receives pressurized air, or some other pressurized fluid, from a bladder control hose 150. The bladder control hose 150 provides a passageway that longitudinally extends from a pressurized fluid source (not shown) to the head spray assembly 46. The wafer polishing system 10 using, for example, pilot operated pneumatic valves or other similar pressure control devices controls the supply of pressurized fluid to the bladder control hose 150. The pressurized fluid source is controlled based on a pressure sensor (not shown) that monitors the fluid pressure within the bladder 86. In a deflated state, the bladder 86 collapses to a height that is below the top surface 76 of the head spray assembly 42. When inflated, the bladder radially expands to extend above the top surface 76.

Referring now to FIGS. 2, 3, 6 and 7, the operation of presently preferred head spray mechanism 32 will be explained. When a wafer carrier 28 with a wafer mounted thereon completes the polishing operation at one of the presently preferred polishing stations, 34a, 34b 34c, the wafer carrier 28 is detachably mounted on the presently preferred conveyor 26. The head spray mechanism 32 is then activated. Activation of the head spray mechanism 32 to clean and rinse the wafer carrier 28 and the wafer 16 can be done alone or in conjunction with activation of the head diametrical wash. When activated, the rotary actuator 42 is activated to rotatably pivot the rotary arm 44 thereby moving the head spray mechanism 32 from the park position as illustrated in FIG. 2, to the spray position as illustrated in FIG. 7. The wafer polishing system 10 is provided feedback signals from the position sensors in the rotary actuator 42 to indicate that the head spray mechanism 32 has swung from the park position to the spray position.

When in the spray position, the head spray assembly 46 is positioned adjacent the wafer carrier 28 with the wafer 16 positioned therebetween. The bladder 86 is then inflated by operating the pilot operated pneumatic valves. Once inflated, the bladder 86 contacts a portion of the underside of the conveyor 26 that surrounds the wafer carrier 28. The bladder 86 thereby forms a circular seal between the head spray assembly 46 and the conveyor 26 with the wafer carrier 28 positioned therein. The pressure sensor monitors the inflation pressure of the bladder. 86 and provides feedback signals when the bladder 86 achieves a predetermined pressure. The feedback signals are used to initiate operation of pilot valves to introduce pressurized liquid to the liquid supply line 114. The liquid flows through the inlet 106 and into the housing 80. The liquid can be water or any other liquid capable of rinsing and cleaning the wafer carrier 28 and the wafer 16. In the presently preferred embodiments, the liquid is deionized water.

Within the housing 80, the liquid flows through the passageway 126 in the rotary shaft 118, through the passageways 140 in the manifold 120 and is discharged from the spray nozzles 84. The angle of discharge of the spray nozzles 84 causes the liquid to be in liquid communication with the face of the wafer 16 and the sides of the wafer carrier 28. The liquid is in liquid communication with the sides of the wafer carrier 28 since the liquid also sprays into the annulus formed between the wafer carrier 28 and the conveyor 26. The discharge of liquid from the spray nozzles 84 creates the reverse force thereby causing the rotating element 82 to rotate as indicated by arrows 148 in FIG. 7. Rotation of the rotating element 82 allows the spray pattern of the spray nozzles 84 to aggressively and uniformly rinse and clean the face of the wafer 16 and the exposed surfaces of the wafer carrier 28.

The liquid is contained within the head spray assembly 46 by the bladder 86 and flows by gravity to the basin 96 within the housing 80. The liquid containing fluid and materials rinsed from the wafer 16 and the wafer carrier 28 flows by gravity to the drain outlet 98. From the drain outlet, the liquid flows through the drain hose 100 and out of the wafer polishing system 10. The drain outlet 98 is capable of accommodating liquid discharged from the head spray mechanism 32 as well as from the diametrical face wash when both are activated simultaneously.

The wash time of the head spray mechanism 32 is variable and can be controlled to correspond with the throughput requirements of the wafer polishing system 10 and the degree of washing required. In the presently preferred wafer polishing system 10, both head spray mechanisms 32 can operate simultaneously or individually depending on system requirements. For the presently preferred wafer polishing system 10, the wash time is approximately 5 seconds. When the wash time has expired, the liquid supplied to the liquid inlet 106 is turned off and the bladder 86 is subsequently deflated. The rotary actuator 42 is then actuated to pivotally rotate the rotary arm 44 to return the head spray mechanism 32 to the park position until the next polishing operation is completed.

From the foregoing an improved system and method for rinsing and cleaning the wafer carrier 28 and the wafer 16 mounted thereon has been described. The system advantageously provides automatic washing while having little or no effect on the throughput operation of the wafer polishing system 10. In addition, the head spray mechanism 32 has the capability to rotationally spray thereby providing aggressive cleaning action while containing the spray liquid. Containment of the spray liquid advantageously minimizes the generation of particles and other material above the polishing process.

It is intended that the foregoing detailed description be regarded as illustrative rather than limiting, and that it be understood that the following claims, including all equivalents, are intended to define the scope of this invention.

I claim:

1. A head spray assembly for rinsing and cleaning a wafer carrier and a semiconductor wafer mounted thereon comprising:
   a housing wherein a portion of the housing defines an opening therein, the housing being operably positionable between a first position wherein the housing is spaced away from the wafer carrier and a second position wherein the housing is positioned adjacent the wafer carrier such that the semiconductor wafer is positioned between the housing and the wafer carrier; and
   a plurality of spray nozzles disposed within the housing that are selectively activatable to provide a discharge of pressurized liquid through the opening in the housing, wherein the spray nozzles are rotatable.

2. The head spray assembly of claim 1, wherein the spray nozzles are fixedly mounted in a rotating element that is rotatable as a result of a force created by liquid discharge from the spray nozzles.

3. The head spray assembly of claim 2, wherein the rotating element comprises a plurality of passageways therethrough for supplying liquid to the spray nozzles.

4. The head spray assembly of claim 1 wherein the spray nozzles are individually rotatable as a result of a force created by liquid discharge from the spray nozzles.

5. The head spray assembly of claim 1, further comprising an inflatable bladder adapted to form an annular ring that is coupled to the head spray assembly.

6. The head spray assembly of claim 1, wherein the spray nozzles comprise an aperture that discharges liquid at an angle with respect to the longitudinal axis of the spray nozzles.

7. The head spray assembly of claim 1, wherein the head spray assembly further comprises a drain capable of collecting liquid discharged from the spray nozzles.

8. A head spray mechanism for rinsing and cleaning a wafer carrier and a semiconductor wafer positioned thereon, the head spray mechanism comprising:
   a rotary actuator;
   a rotary arm having a proximal and a distal end that is fixedly coupled to the rotary actuator at the proximal end;
   a head spray assembly that is fixedly coupled to the distal end of the rotary arm and is operably positionable between a first position wherein the head spray assembly is spaced away from the wafer carrier and a second position wherein the head spray assembly is positioned adjacent the wafer carrier, the head spray assembly comprising:
      a rotating element;
      a plurality of spray nozzles positioned on a face of the rotating element; and
      a housing coupled with the rotating element, wherein the rotating element is rotatably disposed within the housing such that the interior of the housing, the wafer carrier and the semiconductor wafer are in liquid communication with liquid discharged from the spray nozzles.

9. The head spray mechanism of claim 8, further comprising an inflatable bladder adapted to form an annular ring that is coupled to the head spray assembly.

10. The head spray mechanism of claim 8, wherein the spray nozzles are in liquid communication with a pressurized liquid source.

11. The head spray mechanism of claim 8, wherein each of the spray nozzles comprises an aperture that discharges liquid at an angle with respect to the longitudinal axis of the spray nozzles thereby creating a force that rotates the rotating element.

12. The head spray mechanism of claim 8, wherein the rotating element comprises a plurality of passageways therethrough for supplying liquid to the spray nozzles.

13. The head spray mechanism of claim 8, wherein the rotating element comprises a rotary shaft that rotatably connects the rotating element with the housing.

14. The head spray mechanism of claim 8, wherein the head spray assembly further comprises a drain capable of collecting liquid discharged from the spray nozzles.

15. A head spray mechanism for rinsing and cleaning a wafer carrier and a semiconductor wafer positioned thereon, the head spray mechanism comprising:
   a head spray assembly that includes a rotatable spray nozzle, wherein the head spray assembly is operable to move between a first position and a second position,
   the head spray assembly positioned away from the wafer carrier and the semiconductor wafer in the first position,
   the head spray assembly positioned such that the semiconductor wafer is between the wafer carrier and the rotatable spray nozzle in the second position.

16. The head spray mechanism of claim 15, wherein the first position is a park position and the second position is a spray position.

17. The head spray mechanism of claim 15, wherein the rotatable spray nozzle is deactivated when the head spray assembly is in the first position and is operable to spray pressurized liquid when the head spray assembly is in the second position.

18. The head spray mechanism of claim 17, wherein the pressurized liquid is in liquid communication with the wafer carrier and the semiconductor wafer.

19. The head spray mechanism of claim 15, wherein the rotatable spray nozzle is operable in the second position to rotate when pressurized liquid is discharged from the rotatable spray nozzle against the wafer carrier and the semiconductor wafer.

20. The head spray mechanism of claim 15, wherein the head spray assembly is operable to contain liquid discharged by the rotatable spray nozzle.

21. The head spray mechanism of claim 15, wherein the head spray assembly also includes a rotating element, the rotatable spray nozzle positioned on the rotating element, wherein pressurized liquid is provided through the rotating element to the rotatable spray nozzle.

22. The head spray mechanism of claim 15, further comprising a rotary actuator coupled with a first end of a rotary arm, wherein a second end of the rotary arm is coupled with the head spray assembly, the rotary actuator operable to move the head spray assembly between the first and second positions.

* * * * *